United States Patent
Elsharawy

(10) Patent No.: US 9,240,317 B2
(45) Date of Patent: Jan. 19, 2016

(54) HIGH TEMPERATURE GAN BASED SUPER SEMICONDUCTOR AND FABRICATION PROCESS

(71) Applicant: UMM AL-QURA UNIVERSITY, Makkah (SA)

(72) Inventor: Elbadawy Elsharawy, Makkah (SA)

(73) Assignee: Umm Al-Qura University, Makkah (SA)

(*) Notice: Subject to any disclaimer, the term of this patent is extended or adjusted under 35 U.S.C. 154(b) by 0 days.

(21) Appl. No.: 14/226,883

(22) Filed: Mar. 27, 2014

(65) Prior Publication Data

US 2014/0291692 A1    Oct. 2, 2014

Related U.S. Application Data

(60) Provisional application No. 61/806,333, filed on Mar. 28, 2013.

(51) Int. Cl.
| | |
|---|---|
| H01L 29/16 | (2006.01) |
| H01L 21/02 | (2006.01) |
| H01L 29/20 | (2006.01) |
| H01L 29/26 | (2006.01) |
| H01L 29/778 | (2006.01) |
| H01L 29/10 | (2006.01) |

(52) U.S. Cl.
CPC ........ *H01L 21/0254* (2013.01); *H01L 21/0257* (2013.01); *H01L 21/02381* (2013.01); *H01L 21/02447* (2013.01); *H01L 21/02458* (2013.01); *H01L 21/02502* (2013.01); *H01L 21/02521* (2013.01); *H01L 29/1075* (2013.01); *H01L 29/2003* (2013.01); *H01L 29/26* (2013.01); *H01L 29/7787* (2013.01); *H01L 2924/1077* (2013.01)

(58) Field of Classification Search
CPC .............................................. H01L 2924/1077
See application file for complete search history.

(56) References Cited

U.S. PATENT DOCUMENTS

| | | | |
|---|---|---|---|
| 5,661,112 | A | 8/1997 | Hatta et al. |
| 6,764,926 | B2 | 7/2004 | Takeuchi et al. |
| 7,164,180 | B2 | 1/2007 | Yoshida et al. |
| 8,183,086 | B2 | 5/2012 | Sung |
| 8,274,110 | B2 | 9/2012 | Sandhu et al. |
| 8,278,124 | B2 | 10/2012 | Sutter et al. |
| 8,426,277 | B2 | 4/2013 | Lin et al. |
| 2006/0244361 | A1* | 11/2006 | Kim ............ B82Y 10/00 313/495 |

OTHER PUBLICATIONS

Wu et al., Applied Physics Letters 89, 062505 (2006)).*
Sheetz et al (Physical Review B 84, 075304 (2011)).*
Neugebauer et al (Mat.Res. Soc.Symp.Proc.vol. 339.1994 Material Research Society).*

* cited by examiner

*Primary Examiner* — Matthew W Such
*Assistant Examiner* — Ali Naraghi
(74) *Attorney, Agent, or Firm* — Hauptman Ham, LLP

(57) ABSTRACT

A low temperature GaN based super semiconductor comprising a GaN supercell having equal percentages of Cu and at least one material from the family of P, As, or Sb. The GaN supercell is doped in accordance with the formula $Ga_{1-2x}Cu_xAs_xN$, wherein x is from about 6.25% to about 25%. The supercell is deposited on GaN grown on silicon substrate.

3 Claims, 2 Drawing Sheets

HIGH TEMPERATURE GAN BASED SUPER SEMICONDUCTOR AND FABRICATION PROCESS

FIELD OF THE INVENTION

This invention relates generally to Gallium Nitride (GaN) based super semiconductors, and more particularly to GaN based super semiconductors that exhibit very high mobility at room temperature, and to a process of fabricating them.

BACKGROUND OF THE INVENTION

In solid-state physics, electron mobility characterizes how quickly an electron can move through a metal or semiconductor when pulled by an electric field. In semiconductors, there is an analogous quantity for holes, called hole mobility. When an electric field E is applied across a piece of material, the electrons respond by moving with an average velocity called the drift velocity ($v_d$). Then the electron mobility μ is defined as $$v_d = \mu E$$

When there is no applied electric field, electrons move around randomly in a solid, or in the case of semiconductors both electrons and holes move around randomly. Therefore, on average there will be no overall motion of charge carriers in any particular direction over time.

In the electronics industry there is a strong interest in materials known as superconductors or super semiconductors that demonstrate a very high mobility at room temperature. Super conductors have a band structure that is uniquely characterized by the symmetry near Fermi level [1]. The energy gap, Eg, in superconductors is very small (Eg<3.5 kTc, where k is Boltzman constant). Superconductivity in diamond heavily doped with boron was discovered in 1994. Covalent superconductivity in diamond was investigated and hole-pairing instead of electrons was used to explain these phenomena [2]. There are two general types of superconductors known at the present time, type I superconductors and type II superconductors.

Type I superconductors are basic elements or alloys that usually have a very low critical temperature (Tc). Below Tc, ohmic resistance drops to zero and the material can carry large DC current without any conductor loss. In addition to lossless DC conduction, a superconductor also emits a magnetic field below a critical value (Hc). Superconductivity of this type has been attributed to the formation of electron-pairs (Cooper pair) [1] which can flow effortlessly in the superconducting material. This is known as BCS Theory [1].

Type II superconductors are typically ceramic insulators at room temperature that exhibit superconducting characteristics below Tc. Tc in Type II superconductors is generally higher than those in Type I and often Type II is referred to as high temperature superconductors. Examples of this type of superconductor include YBaCuO, BiSrCaCuO, and HgBaCaCuO. There is no clear explanation on how Type II superconductors work. In general, this type of material consists of three components. The first component is CaO, SrO, BaO, or a mix of these oxides. This is the base material to form the superconducting crystal. The second component is CuO. The CuO is the acceptor material that generates holes near the Fermi level. The third component is Yo, Hg, BiO, PbO, or SnO, etc., which function as donor atoms to generate electrons near the Fermi level. The list of high temperature superconductors has been steadily growing since their initial discovery in 1986. The list now includes other elements than those mentioned above, including Fe and As, but not limited to those.

In 2008, scientists at the Brookhaven National Laboratory confirmed the possibility of electron pairing above the critical temperature of superconductors. This means, at least in theory, that a material can have very high mobility at room temperature regardless of whether the material is in a superconducting state or not. The key features of such a material are based on their band structure as: (1) the energy gap is near zero; and (2) the band structure is symmetric around the Fermi level to suggest pairing of electrons and/or holes.

To date, the only example of material that meets the criteria of a super semiconductor is Graphene. Graphene is a single layer of carbon atoms with a hexagonal crystal lattice. Because of its unique properties, Graphene recently has been the subject of extensive research. The measured mobility of doped Graphene is in the order of 10,000-20,000 $cm^2$/Vs. The mobility of undoped Graphene is estimated at 200,000 $cm^2$/Vs. This is more than 1000 times greater than bulk graphite, which has an electron mobility of 100 $cm^2$/Vs. Graphene also has one of the longest known mean free paths to support ballistic electrons [4]. All of these characteristics suggest that Graphene meets the above criteria to be considered a super semiconductor.

However, graphene is difficult to grow in large wafers and the yield is low because of damage to the single layer material in the process of electronic device fabrication. Because of this, Graphene is used mainly for the fabrication of discrete devices.

GaN is gaining in popularity in high power electronic devices at microwave frequencies due to a high breakdown electric field, good thermal conductivity, and the ability to operate at high temperature without significant loss of performance. Also, the ability to grow GaN on silicon or SiC wafers promises low cost and a decent level of integration. The wide bandgap of GaN makes doping with other materials an effective tool to control the electrical properties of the lattice.

Most of the work on doping GaN focuses on acquiring conductivity. P or N type doping includes materials such as Mg and Si. Other materials such as copper (Cu) and arsenic (As) have been suggested to acquire other electrical properties. Doping GaN with copper produces magnetic properties that depend on the doping concentration [6, 7]. Doping GaN with arsenic [8] resulted in significantly shifting the emission spectrum of a GaN light emitting diode (LED) toward blue light and increasing the intensity of the emitted light by several orders of magnitude compared to undoped GaN LEDs.

Previous work on doping GaN with copper and arsenic used either copper or arsenic, but not both. Arsenic was doped into GaN at a very small percentage (<1%). Also arsenic was doped into both Ga and N sites. In previous work on doping with arsenic, the arsenic atoms mostly occupied the N sites that resulted in a downward shift in the spectrum [7].

It would be highly advantageous to enhance the mobility of electrons and holes in GaN without the deficiencies of the prior art.

BRIEF SUMMARY OF THE INVENTION

The present invention is directed to a class of semiconductor materials that exhibit very high mobility at high (room) temperature. The materials are GaN based and allow for integration of high performance microwave and millimeter wave circuits into the same wafer. In particular, the invention is directed toward a gallium nitride (GaN) based superconductor that has enhanced mobility of electrons and holes, and to a process for fabricating the GaN based superconductor.

Applicant uses doping to enhance the mobility of electrons and holes in the GaN. To do this, the band structure is engineered to produce near zero energy gap (Eg) and to enhance the symmetry of the band structure near Fermi level.

Copper doping creates energy levels in the valence band near the Fermi level [6,7]. To balance the copper effects on band structure, an n dopant is needed. When a copper atom occupies the Ga site in the GaN cell, it contributes two holes to the valence band. The n type dopant contributes a pair of electrons to the conduction band.

The n type dopants that can be used for the purpose of contributing a pair of electrons include group V elements such as As, P, and Sb. The family of materials As, P, and Sb are used at a much higher percentage than previous work, and in equal percentage to copper to ensure the hole-electron pair exchange. In the present disclosure and following examples, As is used as an example for convenience but it will be understood that any of the group V elements can be included.

BRIEF DESCRIPTION OF THE DRAWINGS

The foregoing, as well as other objects and advantages of the invention, will become apparent from the following detailed description when taken in conjunction with the accompanying drawings, wherein.

DETAILED DESCRIPTION OF THE PREFERRED EMBODIMENTS

A major objective of the present invention is to provide a class of semiconductor materials that exhibit very high mobility at room temperature. These materials are GaN based and allow the fabrication of low temperature GaN based super semiconductor material on silicon based wafers or substrates. The GaN based materials allow for integration of high performance microwave and millimeter wave circuits into the same wafer. The noise figure of field effect transistor (EFT) devices is inversely proportional to the mobility of the substrate while the gain and cutoff frequency increase with mobility. GaN is chosen for its wide bandgap, which makes doping effective in controlling the electrical properties of the material. Very high mobility can be acquired using a band structure similar to superconducting materials.

Figure 1:
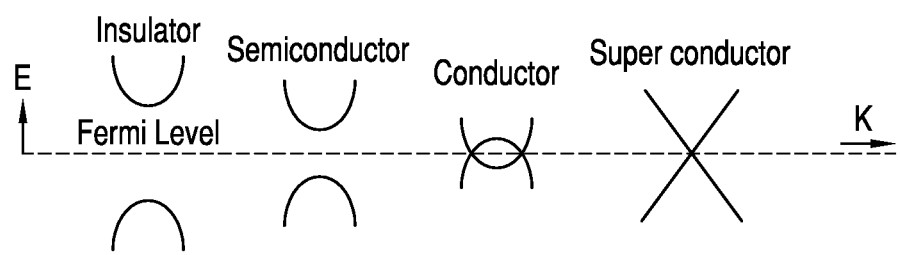
FIG. 1 illustrates the band structure of superconductors compared to other materials.

The band structure of different materials, including superconductors, is illustrated in FIG. 1. The drift mobility is given by $$\mu = \frac{q}{m^*}\tau \quad (1)$$

Where q is the elementary charge, $m^*$ is the carrier effective mass, and $\tau$ is the average scattering time. The effective mass is related to the band structure as $$\frac{1}{m^*} = \frac{1}{\hbar^2} \cdot \frac{d^2\varepsilon}{dk^2} \quad (2)$$

From FIG. 1 and equations (1) and (2), it is easy to show that electrons and holes in superconductors have near zero rest effective mass. The scattering time is also much longer in super semiconductors compared to conventional semiconductors, as discussed hereinafter with regard to Graphene [4].

Figure 2:
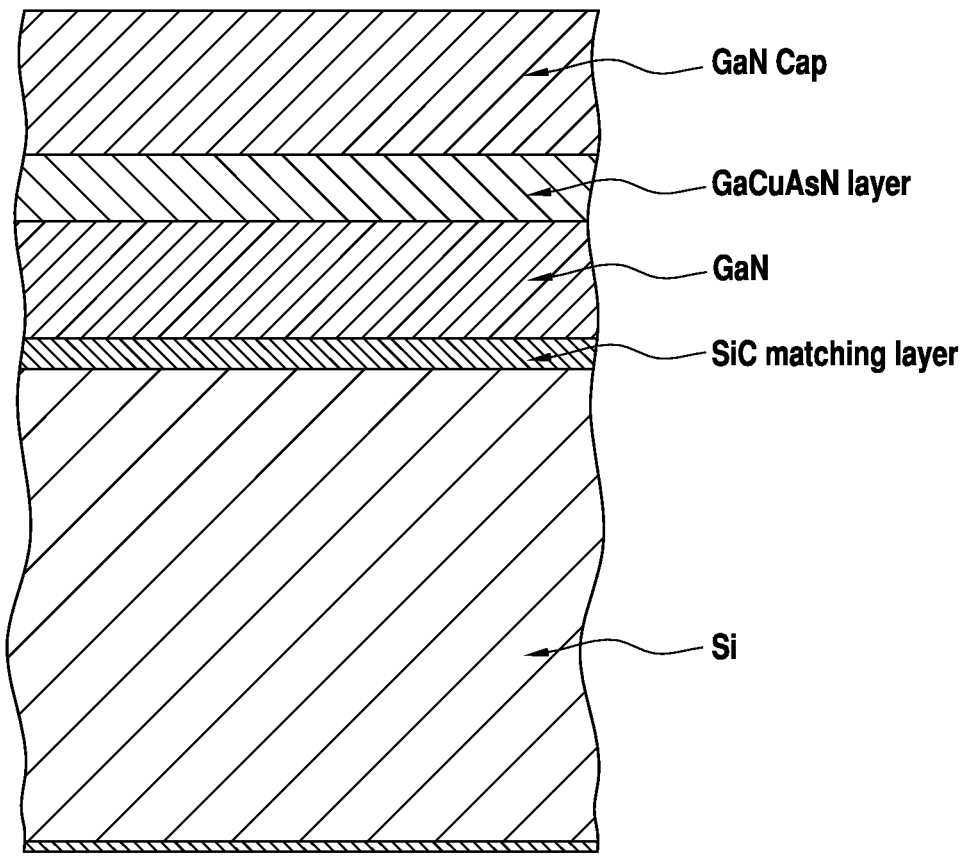
FIG. 2 is a representative side view of a super semiconductor according to the invention deposited on a substrate.

In essence, the invention contemplates a high (room) temperature super semiconductor of GaN deposited on a silicon carbide wafer substrate with positive or negative doping with magnesium (Mg) or silicon (Si). The super semiconductor 10 deposited on a substrate 20 is depicted in FIG. 2. Other materials such as copper (Cu) and arsenic (As) may be added to acquire electrical properties. Electron pair contribution can be made by phosphorous (P), arsenic (As) or antimony (Sb). Mobility may be an electron flow in a lattice of 8 GaN cells in a 2×2×2 arrangement with each cell having 4 Ga atoms and 4 N atoms.

A GaN super cell with doping has equal percentages of Cu and at least one of phosphorous (P), arsenic (As) or antimony (Sb). If As is used, the result is $Ga_{(1-2x)}Cu_{(x)}As_{(x)}$, where x is between 6.25% and 25%, preferably 25%. If x is the minimum of 6.25%, the result would be 28 Ga+2 Cu+2 As+32 N atoms. In either event, the super cell is deposited by a metalorganic chemical vapor deposition (MOCVD) process.

To use group V elements such as As, P, or Sb as doping agents to produce a low temperature GaN based superconductor that has a pair of electrons near the Fermi level and has enhanced mobility of electrons and holes, several conditions must be met (the examples given below and hereinafter are for arsenic as the doping agent):

(1) The As, P, or Sb must occupy the Ga site;
(2) A pair of As/P/Sb and copper atoms must exist in the same cell for the electrons to pair with holes from copper atoms; and
(3) High mobility starts when GaN supercells have more than two pairs of Cu—As/P/Sb atom pair exist atoms. A "supercell" is defined as 8 GaN cells in a 2×2×2 arrangement with each cell having 4 Ga atoms and 4 N atoms, i.e. the total number of atoms in a supercell is 32 Ga atoms and 32 N atoms. However, significant improvement in mobility occurs when at least three Cu—As atom pairs exist in the supercell to allow an uninterrupted flow of electrons in the lattice.

The final form of the doped GaN supercell is $Ga_{1-2x}Cu_x As_x N$. The first and second conditions above can be met using the metalorganic vapor phase epitaxy (MOCVD) with a single precursor for both copper and As/P/Sb such $CuAsF_6$, $CuSbF_6$ or compounds that include this hex-fluoride chemical. To meet the third condition, the minimum that the concentration x can be is 6.25%, i.e., 28 Ga+2 Cu+2 As+32 N, which when entered into the final formula specified above is $Ga_{0.875}Cu_{0.0625}As_{0.0625}N$. The maximum occurs when each of the eight GaN cells in the supercell has a Cu and an As pair replacing Ga atoms. Thus, in the maximum concentration each of the eight cells has 2 Ga+Cu+As+4 N and the final formula becomes $Ga_{0.5}Cu_{0.25}As_{0.25}N$, which is a concentration of 25% and the preferred recommended doping concentration to maintain the quality of the single crystal.

Modified GaN will be suitable for monolithic microwave integrated circuit (MMIC) applications.

The new and improved low temperature GaN based super semiconductor of the present invention includes a GaN supercell having equal percentages of Cu and at least one material from the family of P, As, or Sb. The GaN supercell is doped in accordance with the formula $Ga_{1-2x}Cu_x As_x N$, wherein x is greater than 6.25% and can be as high as 25%. Generally, a value of x of 15-20% results in a significant improvement in mobility, and 25% is a preferred value.

A preferred embodiment of this invention is shown in FIG. 2, where the doped GaN is grown on a matched layer of GaN which in turn is grown on a layer SiC. The SiC matches the GaN to the Si wafer.

While particular embodiments of the invention have been illustrated and described in detail herein, it should be understood that various changes and modifications may be made in the invention without departing from the spirit and scope of the invention as defined by the appended claims.

What is claimed is:

1. A low temperature GaN based super semiconductor, comprising:
    a GaN supercell having equal percentages of Cu and at least one material from the group consisting of P, As, and Sb, wherein the GaN supercell is doped in accordance with a formula selected from the group consisting of $Ga_{1-2x}Cu_xAs_xN$, $Ga_{1-2x}Cu_xP_xN$ and $Ga_{1-2x}Cu_xSb_xN$ wherein x is from about 6.25% to about 25%.

2. The super semiconductor as claimed in claim 1, wherein: x is from about 15% to about 20%.

3. The super semiconductor as claimed in claim 1, wherein: x is 25%.

* * * * *